US012610692B2

(12) United States Patent
Xu et al.

(10) Patent No.: US 12,610,692 B2
(45) Date of Patent: Apr. 21, 2026

(54) DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yang Xu, Beijing (CN); Tinghua Shang, Beijing (CN); Guomeng Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 563 days.

(21) Appl. No.: 18/041,997

(22) PCT Filed: Apr. 6, 2022

(86) PCT No.: PCT/CN2022/085293
§ 371 (c)(1),
(2) Date: Feb. 16, 2023

(87) PCT Pub. No.: WO2023/193137
PCT Pub. Date: Oct. 12, 2023

(65) Prior Publication Data
US 2024/0276779 A1 Aug. 15, 2024

(51) Int. Cl.
*H10K 59/122* (2023.01)
*G09G 3/3266* (2016.01)
(Continued)

(52) U.S. Cl.
CPC ......... *H10K 59/122* (2023.02); *G09G 3/3266* (2013.01); *H10K 59/1315* (2023.02); *H10K 59/8723* (2023.02); *H10K 59/873* (2023.02)

(58) Field of Classification Search
None
See application file for complete search history.

(56) References Cited

U.S. PATENT DOCUMENTS 10,586,837 B2    3/2020   Gao
10,720,604 B2    7/2020   Kim et al.
(Continued)

FOREIGN PATENT DOCUMENTS

CN        107565048 A     1/2018
CN        109148379 A     1/2019
(Continued)

OTHER PUBLICATIONS

International Search Report and Written Opinion dated Nov. 23, 2022, for corresponding PCT Application No. PCT/CN2022/085293.

*Primary Examiner* — Khaja Ahmad
(74) *Attorney, Agent, or Firm* — Kinney & Lange, P.A.

(57) ABSTRACT

A display panel and a display device are provided. The display panel includes: a plurality of sub-pixels disposed in a display region; at least one dam disposed in the peripheral region; a first electrode layer disposed on the base substrate; a pixel defining layer a spacer layer and an encapsulation structure including a first encapsulation layer, a second encapsulation layer and a third encapsulation layer. A plurality of spacers are located in the spacer layer. Among the spacers, a first spacer is located in the peripheral region, and is located at a position farthest away from a center of the display region. An orthographic projection of a boundary of the second encapsulation layer is located on a side of an orthographic projection of at least one dam, and an orthographic projection of the first spacer is located on a side of the orthographic projection of the boundary.

19 Claims, 10 Drawing Sheets

(51) Int. Cl.
　　　*H10K 59/131*　　　(2023.01)
　　　*H10K 59/80*　　　(2023.01)

(56)　　　　　　References Cited

U.S. PATENT DOCUMENTS

| 11,367,759 | B2 | 6/2022 | Huh | |
| 2016/0268356 | A1* | 9/2016 | Go | H10K 59/8723 |
| 2018/0013092 | A1* | 1/2018 | Park | H10K 59/8723 |
| 2020/0136087 | A1* | 4/2020 | Kim | H10K 59/122 |
| 2020/0212140 | A1* | 7/2020 | Huh | H10H 20/854 |
| 2022/0052133 | A1 | 2/2022 | Yang et al. | |
| 2022/0231257 | A1 | 7/2022 | Wang et al. | |
| 2023/0172032 | A1 | 6/2023 | Yang et al. | |

FOREIGN PATENT DOCUMENTS

| CN | 110911467 | A | 3/2020 |
| CN | 111106146 | A | 5/2020 |
| CN | 111384104 | A | 7/2020 |
| CN | 111490088 | A | 8/2020 |
| CN | 112885879 | A | 6/2021 |
| JP | 2006126817 | A | 5/2006 |
| KR | 100671644 | B1 | 1/2007 |
| WO | 2021184372 | A1 | 9/2021 |

* cited by examiner

DISPLAY PANEL AND DISPLAY DEVICE

CROSS REFERENCE TO RELATED APPLICATION(S)

This application is a National Stage Application of International Application No. PCT/CN2022/085293, filed on Apr. 6, 2022, entitled "DISPLAY PANEL AND DISPLAY DEVICE", which is incorporated herein in its entirety by reference.

TECHNICAL FIELD

The present disclosure relates to a field of display technology, in particular to a display panel and a display device.

BACKGROUND

With a continuous development of display technology, an organic light emitting diode (OLED) display panel has been increasingly used in various electronic devices due to its advantages of self-light-emitting, wide angle of view, high contrast, low power dissipation, high reaction speed, etc. In a process of manufacturing an organic light-emitting diode display panel, it is required to evaporate the light-emitting material at each opening defined by a pixel defining layer to form a light-emitting layer. For example, a mask may be separated from a backplane by using a protruding support on the backplane to avoid large area contact between the backplane and the mask.

The above information disclosed in this part is only used to understand the background of the invention concept of the present disclosure. Therefore, the above information may include information that does not constitute the existing technologies.

SUMMARY

In one aspect, there is provided a display panel, including: a base substrate, the base substrate including a display region and a peripheral region; a plurality of sub-pixels disposed in the display region, wherein the sub-pixel includes a first electrode, a second electrode and a functional layer between the first electrode and the second electrode; at least one dam disposed in the peripheral region; a first electrode layer disposed on the base substrate, wherein the first electrodes of the plurality of sub-pixels are located in the first electrode layer; a pixel defining layer disposed on a side of the first electrode layer away from the base substrate; a spacer layer disposed on a side of the pixel defining layer away from the base substrate; an encapsulation structure disposed on a side of the spacer layer far away from the base substrate, the encapsulation structure including: a first encapsulation layer disposed on the side of the spacer layer away from the base substrate; and a second encapsulation layer disposed on a side of the first encapsulation layer away from the base substrate; and a third encapsulation layer disposed on a side of the second encapsulation layer away from the base substrate, wherein the first encapsulation layer is an inorganic material encapsulation layer, the third encapsulation layer is an inorganic material encapsulation layer, and the second encapsulation layer is an organic material encapsulation layer, wherein the display panel includes a plurality of spacers located in the spacer layer, the plurality of spacers include a first spacer in the peripheral region, and the first spacer is located at a position farthest away from a center of the display region among the plurality of spacers;

wherein the second encapsulation layer includes a boundary located on a side of the second encapsulation layer away from the display region, and the boundary is a boundary of a part, that protrudes from the display region, of the second encapsulation layer; and wherein an orthographic projection of the boundary of the second encapsulation layer on the base substrate is located on a side of an orthographic projection of the at least one dam on the base substrate close to the display region, and an orthographic projection of the first spacer on the base substrate is located on a side of the orthographic projection of the boundary of the second encapsulation layer on the base substrate close to the display region.

According to some exemplary embodiments, the peripheral region includes a first side region and a second side region, that are respectively located on opposite sides of the display region along the first direction; the display panel further includes at least one scanning driving circuit disposed in at least one of the first side region and the second side region of the peripheral region, and the scanning driving circuit is configured to provide a scanning driving signal to a pixel driving circuit of at least one of the plurality of sub-pixels; and the display panel includes a plurality of first spacers, and some of the plurality of first spacers are located in at least one of the first side region and the second side region of the peripheral region, and have an orthographic projection on the base substrate that falls within an orthographic projection of the at least one scanning driving circuit on the base substrate.

According to some exemplary embodiments, the peripheral region further includes a third side region, a fourth side region and a plurality of corner regions, the third side region and the fourth side region are respectively located on opposite sides of the display region along the second direction, and each of the plurality of corner regions is located between respective adjacent two of the first side region, the third side region, the second side region and the fourth side region; a part of the at least one scanning driving circuit is further located in at least one corner region; and some of the plurality of first spacers are located in the at least one corner region, and have an orthographic projection on the base substrate that falls within the orthographic projection of the at least one scanning driving circuit on the base substrate.

According to some exemplary embodiments, the at least one scanning driving circuit includes a first scanning driving circuit and a second scanning driving circuit, the first scanning driving circuit is configured to provide a light-emitting control signal to the pixel driving circuit of at least one of the plurality of sub-pixels, the second scanning driving circuit is configured to provide a gate scanning signal to the pixel driving circuit of at least one of the plurality of sub-pixels, and an orthographic projection of the first scanning driving circuit on the base substrate is located on a side of an orthographic projection of the second scanning driving circuit on the base substrate away from the display region; and an orthographic projection of some of the first spacers on the base substrate falls within the orthographic projection of the first scanning driving circuit on the base substrate.

According to some exemplary embodiments, an orthographic projection of a part of the boundary of the second encapsulation layer on the base substrate falls within the orthographic projection of the at least one scanning driving circuit on the base substrate.

According to some exemplary embodiments, the orthographic projection of a part of the boundary of the second encapsulation layer on the base substrate falls within the orthographic projection of the first scanning driving circuit on the base substrate.

According to some exemplary embodiments, the display panel further includes: a first voltage lead for transmitting a first voltage; the orthographic projection of the at least one dam on the base substrate at least partially overlaps with an orthographic projection of the first voltage lead on the base substrate; and an orthographic projection of some of the first spacers on the base substrate and the orthographic projection of the first voltage lead on the base substrate are spaced from each other, and the orthographic projection of some of the first spacers on the base substrate is located on a side of the orthographic projection of the first voltage lead on the base substrate close to the display region.

According to some exemplary embodiments, an orthographic projection of at least a part of the boundary of the second encapsulation layer on the base substrate and the orthographic projection of the first voltage lead on the base substrate are spaced from each other, and the orthographic projection of at least a part of the boundary of the second encapsulation layer on the base substrate is located on the side of the orthographic projection of the first voltage lead on the base substrate close to the display region.

According to some exemplary embodiments, the at least one dam includes a first dam, and the first dam is located at a position closest to the center of the display region among the at least one dam; and the orthographic projection of the first spacer on the base substrate is spaced from an orthographic projection of the first dam on the base substrate by a first distance, and the first distance is no less than 100 μm.

According to some exemplary embodiments, the orthographic projection of the boundary of the second encapsulation layer on the base substrate is spaced from the orthographic projection of the first dam on the base substrate by a second distance, the second distance is less than the first distance, and the second distance is no less than 100 μm.

According to some exemplary embodiments, at least one of the first distance and the second distance is in a range of 100 μm to 300 μm.

According to some exemplary embodiments, the first voltage lead includes a first lead boundary close to the display region, the first lead boundary is a boundary of the orthographic projection of the first voltage lead on the base substrate closest to the display region; the first dam includes a first dam boundary close to the display region, and the first dam boundary is a boundary of an orthographic projection of the first dam on the base substrate closest to the display region; the first lead boundary is closer to the display region than the first dam boundary, the encapsulation structure includes only the first encapsulation layer and the third encapsulation layer in a transition area between the first lead boundary and the first dam boundary, and the plurality of spacers are not disposed in the transition region.

According to some exemplary embodiments, a plurality of first spacers are arranged along a first contour line and spaced from each other, the first contour line is a contour line surrounding the display region and being substantially conformal as an outer contour line of the display region, and the first contour line is spaced from the outer contour line of the display region; and the plurality of spacers are arrayed in an array in a first direction and a second direction, starting from the first spacers at periphery towards the center of the display region.

According to some exemplary embodiments, the plurality of spacers are arranged at a first interval in the first direction and at a second interval in the second direction, and a ratio of the first interval to the second interval is in a range of 0.8 to 1.2.

According to some exemplary embodiments, for the first spacer, a distance between the first spacer and a spacer adjacent to the first spacer in the first direction is substantially equal to the first interval; and/or, for the first spacer, a distance between the first spacer and the spacer adjacent to the first spacer in the second direction is substantially equal to the second interval.

According to some exemplary embodiments, for adjacent two corner regions in the first direction, a distribution of the spacers in one of the two corner regions is symmetrical to a distribution of the spacers in the other of the two corner regions with respect to a first symmetry axis; and/or, for adjacent two corner regions in the second direction, a distribution of the spacers in one of the two corner regions is symmetrical to a distribution of the spacers in the other of the two corner regions with respect to a second symmetry axis.

According to some exemplary embodiments, the display panel further includes a planarization layer located on a side of the first electrode layer close to the base substrate; an auxiliary conductive part located in the peripheral region, wherein the auxiliary conductive part is located in the first electrode layer, and the auxiliary conductive part is electrically connected to a first voltage lead; a plurality of openings provided in the auxiliary conductive part, wherein each of the plurality of openings exposes a part of the planarization layer; and a plurality of first covering parts located in the pixel defining layer, wherein the plurality of first covering parts respectively cover the plurality of openings.

According to some exemplary embodiments, an orthographic projection of at least some of the first spacers on the base substrate at least partially overlaps with an orthographic projection of at least some of the first covering parts on the base substrate; and/or, the orthographic projection of at least some of the first spacers on the base substrate at least partially overlaps with an orthographic projection of the auxiliary conductive part on the base substrate.

According to some exemplary embodiments, the plurality of spacers include second spacers located in the peripheral region, and an orthographic projection of the second spacers on the base substrate is located on a side of the orthographic projection of the first spacers on the base substrate close to the display region; and an orthographic projection of some of the second spacers on the base substrate falls within an orthographic projection of a second scanning driving circuit on the base substrate.

According to some exemplary embodiments, an orthographic projection of at least some of the second spacers on the base substrate at least partially overlaps with the orthographic projection of at least some of the first covering parts on the base substrate; and/or, the orthographic projection of at least some of the second spacers on the base substrate at least partially overlaps with the orthographic projection of the auxiliary conductive part on the base substrate.

In another aspect, there is provided a display device including a display panel as described above.

BRIEF DESCRIPTION OF THE DRAWINGS

Other purposes and advantages of the present disclosure will be apparent from the following description of the present disclosure with reference to the accompanying drawings, and may help to have a comprehensive understanding of the present disclosure.

Figure 1:
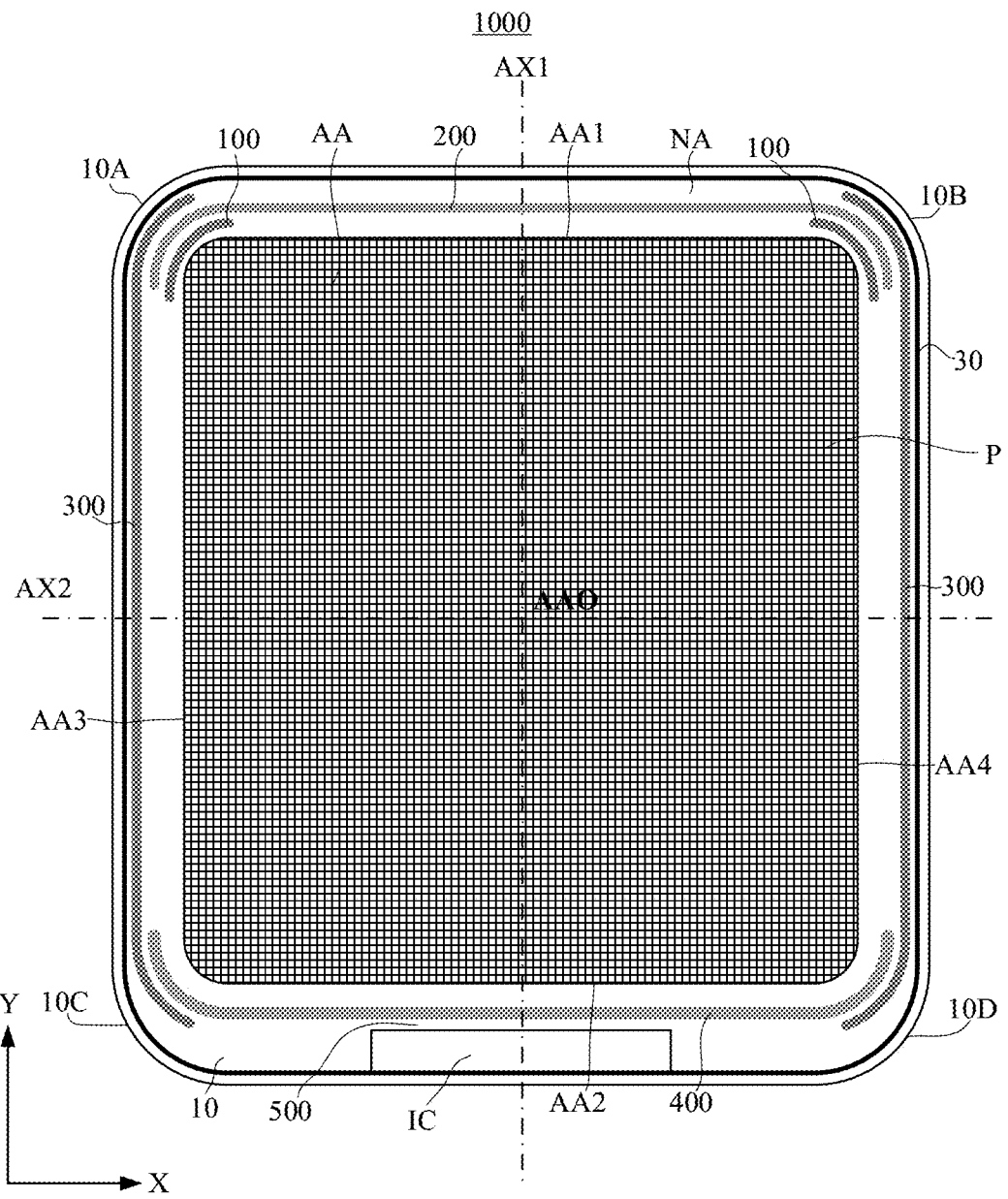
FIG. 1 is a schematic plan view of a display device according to some exemplary embodiments of the present disclosure.

It should be noted that, for the sake of clarity, in the drawings used to describe the embodiments of the present disclosure, the sizes of layers, structures or areas may be enlarged or reduced, that is, these drawings are not drawn according to the actual scale.

DETAILED DESCRIPTION OF EMBODIMENTS

In the following description, for the purpose of explanation, many specific details are set forth to provide a comprehensive understanding of various exemplary embodiments. However, it is obvious that various exemplary embodiments may be implemented without these specific details or with one or more equivalent arrangements. In other cases, well-known structures and devices are shown in block diagram form to avoid unnecessary ambiguity of various exemplary embodiments. In addition, various exemplary embodiments may be different, but need not be exclusive. For example, without departing from the inventive concept, the specific shapes, configurations and characteristics of the exemplary embodiment may be used or implemented in another exemplary embodiment.

In the drawings, for the purpose of clarity and/or description, the size and relative size of the elements may be enlarged. In this way, the size and relative size of each element need not be limited to the size and relative size shown in the drawings. When the exemplary embodiments may be implemented differently, a specific process sequence may be executed differently from the described sequence. For example, two continuously described processes may be substantially performed simultaneously or in a reverse order of the described sequence. In addition, the same reference numerals represent the same elements.

When an element is described as being "on", "connected to", or "coupled to" another element, the element may be directly on, directly connected to, or directly coupled to the other element, or intermediate elements may be existed. However, when an element is described as being "directly on", "directly connected to", or "directly coupled to" another element, there is no intermediate element existed.

Other terms and/or expressions used to describe a relationship between elements should be interpreted in a similar fashion, e.g., "between" versus "directly between", "adjacent" versus "directly adjacent", or "on" versus "directly on" etc., Furthermore, the term "connected" may refer to a physical connection, an electrical connection, a communication connection, and/or a fluid connection. In addition, an X axis, a Y axis and a Z axis are not limited to a three axes of a rectangular coordinate system, and may be interpreted in a broader sense. For example, the X, Y, and Z axes may be perpendicular to each other, or may represent different directions that are not perpendicular to each other. For a purpose of the present disclosure, "at least one of X, Y, and Z" and "at least one of the selected groups consisted of X, Y, and Z" may be interpreted as X only, Y only, Z only, or such as any combination of two or more of X, Y and Z in XYZ, XYY, YZ and ZZ. As used herein, the term "and/or" includes any and all combinations of one or more of the associated listed items.

It should be noted that, although the terms "first", "second", etc. may be used herein to describe various components, members, elements, regions, layers and/or parts, these components, members, elements, regions, layers and/or parts will not be limited by these terms. Rather, these terms are used to distinguish one component, member, element, region, layer and/or part from another. Thus, for example, a first component, a first member, a first element, a first region, a first layer and/or a first part discussed below could be termed a second component, a second member, a second element, a second region, a second layer and/or a second part without departing from the teachings of the present disclosure.

For ease of description, a spatially relational term, e.g., "upper", "lower", "left", "right", etc. may be used herein to describe a relationship between one element or feature with another element or feature as shown in the drawings. It should be understood that the spatially relational term are intended to encompass other different orientations of the apparatus in use or operation in addition to an orientation depicted in the drawings. For example, if the apparatus in the drawings is turned over, the elements described as "below" or "beneath" the other elements or features would then be oriented "above" or "on" the other elements or features.

In the present disclosure, the terms "basically", "about", "approximately", "roughly" and other similar terms are used as approximate terms rather than as terms of degree, and they are intended to explain the fixed deviation of measured or calculated values that will be recognized by those skilled in the art. Taking into account factors such as process fluctuations, measurement problems and errors related to the measurement of a specific amount (i.e., the limitations of the measurement system), the "about" or "approximately" used here includes the stated value, and indicates that the specific value determined by ordinary technicians in the art is within the acceptable deviation range. For example, "about" may be expressed within one or more standard deviations, or within ±30%, ±20%, ±10%, ±5% of the stated values.

It should be noted that the expression "same layer" refers to a layer structure which is formed by forming a layer used to form a specific pattern by the same film-forming process, and then patterning the layer by using the same mask through an one-time patterning process. According to the difference between the specific patterns, the one-time patterning process may include multiple exposures, developments or etching processes, and the specific pattern in the formed layer structure may be continuous or discontinuous. That is, multiple elements, components, structures and/or parts located in the "same layer" are made of the same material and formed by the same composition process. Generally, multiple elements, components, structures and/or parts located in the "same layer" have substantially the same thicknesses.

The embodiment of the present disclosure provides a display panel and a display device. The display panel includes a base substrate, which includes a display region and a peripheral region; a plurality of sub-pixels disposed in the display region, wherein the sub-pixel includes a first electrode, a second electrode and a functional layer between the first electrode and the second electrode; at least one dam disposed in the peripheral region; a first electrode layer disposed on the base substrate, wherein the first electrodes of the plurality of sub-pixels are located in the first electrode layer; a pixel defining layer disposed on a side of the first electrode layer away from the base substrate; a spacer layer disposed on a side of the pixel defining layer away from the base substrate; an encapsulation structure disposed on a side of the spacer layer away from the base substrate, the encapsulation structure including: a first encapsulation layer disposed on the side of the spacer layer away from the base substrate; a second encapsulation layer disposed on a side of the first encapsulation layer away from the base substrate; and a third encapsulation layer disposed on a side of the second encapsulation layer away from the base substrate, wherein the first encapsulation layer is an inorganic material encapsulation layer, the third encapsulation layer is an inorganic material encapsulation layer, and the second encapsulation layer is an organic material encapsulation layer, wherein the display panel includes a plurality of spacers located in the spacer layer, the plurality of spacers include a first spacer located in the peripheral region, and the first spacer is located at a position farthest away from a center of the display region among the plurality of spacers; wherein the second encapsulation layer includes a boundary located on a side of the second encapsulation layer away from the display region, and the boundary is a boundary of a part, that protrudes from the display region, of the second encapsulation layer; and wherein an orthographic projection of the boundary of the second encapsulation layer on the base substrate is located on a side of an orthographic projection of the at least one dam on the base substrate close to the display region, and an orthographic projection of the first spacer on the base substrate is located on a side of the orthographic projection of the boundary of the second encapsulation layer on the base substrate close to the display region. In the embodiment of the present disclosure, the first spacers at periphery are located at an inner side of the boundary of the second encapsulation layer. In this way, the second encapsulation layer is disposed at each position at which the spacer is located. The second encapsulation layer herein may act as a buffer to prevent the first encapsulation layer from being punctured by the spacer. Therefore, with such arrangement, a potential risk of generating a crack in the first encapsulation layer may be effectively eliminated, thereby improving a yield of the display panel.

Figure 2:
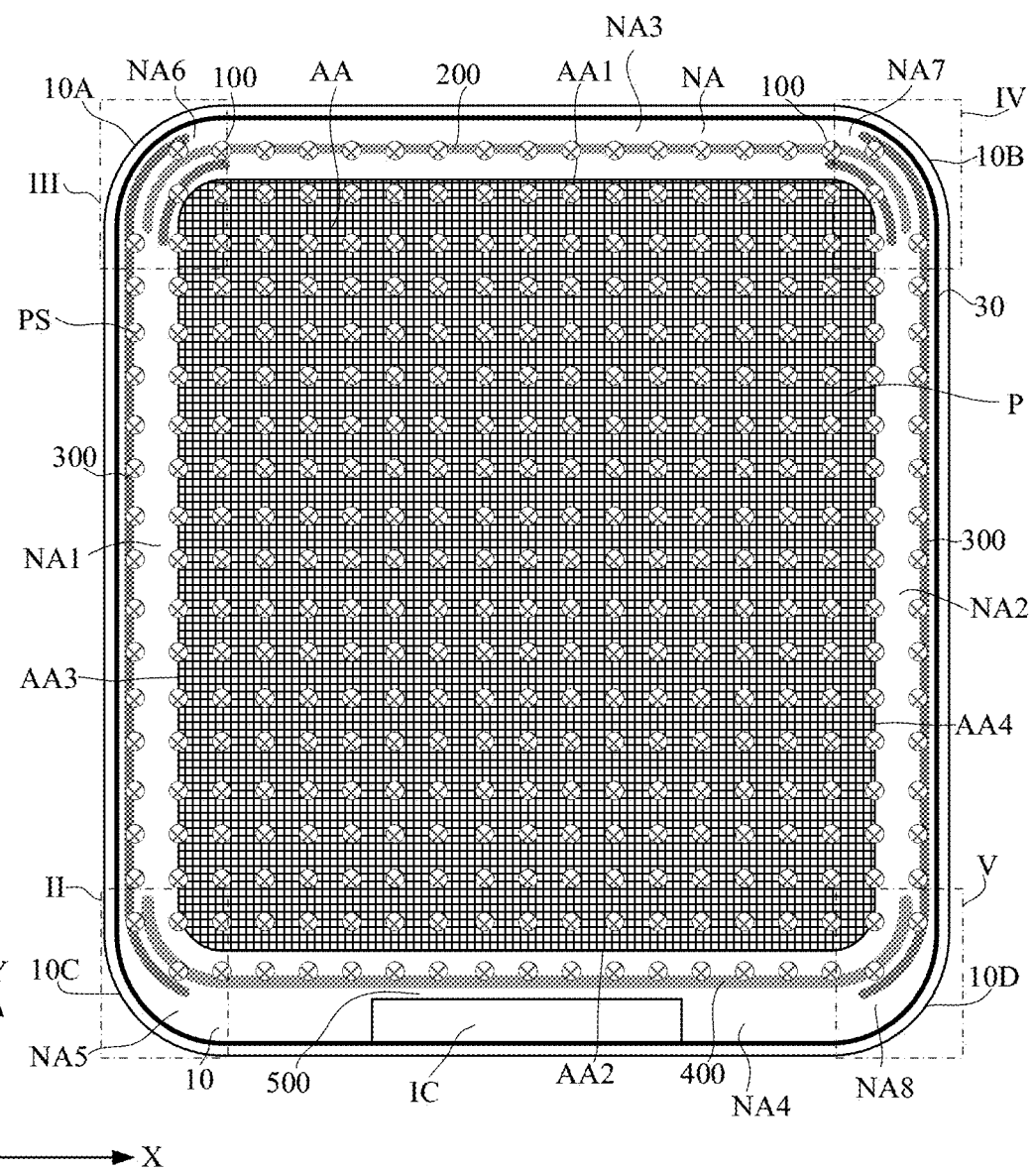
FIG. 2 is a schematic plan view of a display device according to some exemplary embodiments of the present disclosure, in which a distribution of spacers in the display panel is schematically shown.
Figure 3A:
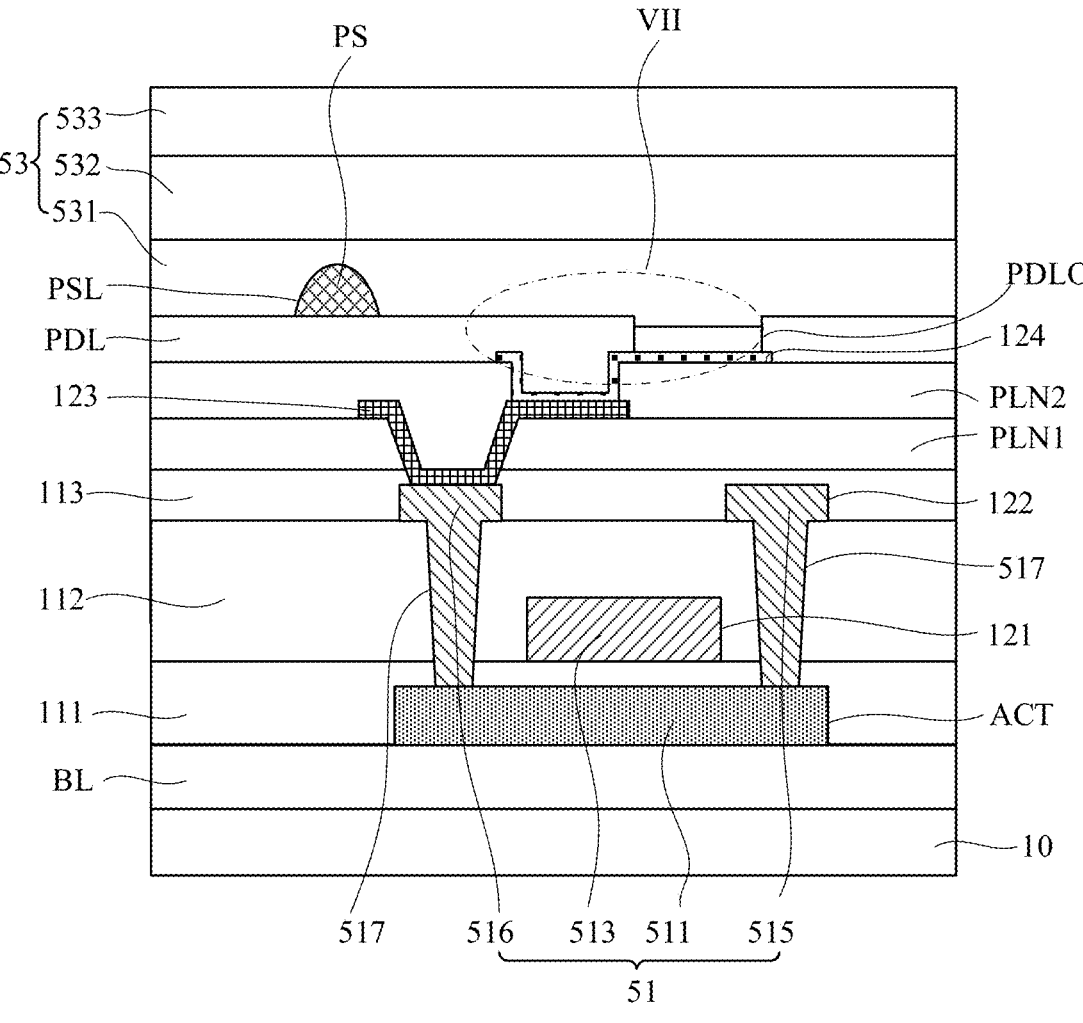
FIG. 3A is a cross-sectional view of the display panel according to some exemplary embodiments of the present disclosure in FIG. 2 along line AA'.
Figure 3B:
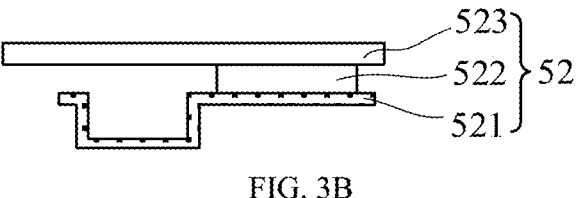
FIG. 3B is a partial enlarged view of part VII in FIG. 3A.

FIG. 1 is a schematic plan view of a display device according to some exemplary embodiments of the present disclosure. FIG. 2 is a schematic plan view of a display device according to some exemplary embodiments of the present disclosure, in which a distribution of spacers in the display panel is schematically shown. FIG. 3A is a cross-sectional view of a display panel along line AA' in FIG. 2 according to some exemplary embodiments of the present disclosure.

With reference to FIGS. 1 and 2, the display device 1000 may include a display panel. The display panel may include a base substrate 10, which may include a display region AA and a peripheral region NA located on at least one side of the display region. It should be noted that in the embodiment shown in FIG. 1, the peripheral region NA surrounds the display region AA. However, the embodiment of the present disclosure is not limited to this. In other embodiments, the peripheral region NA may be located on at least one side of the display region AA, but does not surround the display region AA.

The display panel may include a plurality of pixel units P located in the display region AA. It should be noted that, the pixel unit P is a smallest unit for displaying images. For example, the pixel unit P may include a light-emitting device that emits white light and/or color light.

A plurality of pixel units P may be provided, such that the pixel units P are arranged in an array along a row extending in a first direction (e.g. a row direction) X and a column extending in a second direction (e.g. a column direction) Y. However, the embodiment of the present disclosure does not specifically limit the arrangement of the pixel units P, and the pixel units P may be arranged in various forms. For example, the pixel units P may be arranged by taking a direction inclined relative to the first direction X and the second direction Y as a column direction, and a direction intersecting with the column direction as a row direction.

A pixel unit P may include a plurality of sub-pixels. For example, a pixel unit P may include three sub-pixels, that is, a first sub-pixel SP1, a second sub-pixel SP2 and a third sub-pixel SP3. For another example, a pixel unit P may include four sub-pixels, that is, a first sub-pixel, a second sub-pixel, a third sub-pixel and a fourth sub-pixel. For example, the first sub-pixel SP1 may be a red sub-pixel, the second sub-pixel SP2 may be a green sub-pixel, the third sub-pixel SP3 may be a blue sub-pixel, and the fourth sub-pixel may be a white sub-pixel.

Each sub-pixel may include a light-emitting element and a pixel driving circuit for driving the light-emitting element. For example, the first sub-pixel SP1 may include a first light-emitting element which may emit red light and a first pixel driving circuit for driving the first light-emitting element. The second sub-pixel SP2 may include a second light-emitting element which may emit green light and a second pixel driving circuit for driving the second light-emitting element. The third sub-pixel SP3 may include a third light-emitting element which may emit blue light and a third pixel driving circuit for driving the third light-emitting element.

For example, in an OLED display panel, a light-emitting element of a sub-pixel may include an anode, a light-emitting material layer and a cathode which are stacked. For example, a light-emitting region of the sub-pixel may be a region corresponding to a part of the light-emitting material layer that is sandwiched between the anode and the cathode and is in contact with the anode and the cathode. For example, the pixel defining layer is formed on the anode, and the pixel defining layer has an opening that exposes at least a part of the anode. The light-emitting material layer is at least partially formed in the opening of the pixel defining layer, and the cathode is formed thereon. The light-emitting region of the sub-pixel may be a region defined by the opening of the pixel defining layer. The light-emitting material layer may include, for example, one or more of a hole injection layer, a hole transport layer, a light-emitting layer, a hole barrier layer, an electron transport layer, or an electron injection layer, etc., In addition to the layers described above, other functional film layer(s) may be included in the light-emitting material layer, in which the layer may include an organic material, an inorganic material such as a quantum dot, or the like.

With reference to FIG. 1, the display panel may include components such as a load compensation unit 100, a test circuit 200, a scanning driving circuit 300, and a multiplexer 400 in the peripheral region NA.

The display region AA may include a first boundary AA1, a second boundary AA2, a third boundary AA3 and a fourth boundary AA4 (e.g. an upper boundary, a lower boundary, a left boundary and a right boundary) connected in sequence.

In some embodiments of the present disclosure, an orthographic projection of the display region AA on the base substrate 10 may has a rounded rectangle shape. For the convenience of description, four rounded corners of the rounded rectangle may be respectively referred as a first rounded corner part 10A, a second rounded corner part 10B, a third rounded corner part 10C and a fourth rounded corner part 10D. For example, the first rounded corner part 10A may be located at an upper left corner in FIG. 1, the second rounded corner part 10B may be located at an upper right corner in FIG. 1, the third rounded corner part 10C may be located at a lower left corner in FIG. 1, and the fourth rounded corner part 10D may be located at a lower right corner in FIG. 1.

The test circuit 200 may be located in the peripheral region NA on a side of the peripheral region NA close to the first boundary AA1. The test circuit 200 is disposed opposite to the first boundary AA1, the first rounded corner part 10A and the second rounded corner part 10B.

For example, the test circuit 200 may include a plurality of test pins, which may be configured to provide a test signal. For example, the test signal may include a data signal for the plurality of pixel units P in the display region AA.

The multiplexer 400 may be located on a side close to the second boundary AA2 in the peripheral region NA. The multiplexer 400 is disposed opposite to the second boundary AA2, the third rounded corner part 10C and the fourth rounded corner part 10D.

For example, the multiplexer 400 may perform time division multiplexing on the signal lines in a wiring region. As shown in FIG. 1, the display panel includes an integrated circuit IC disposed in the peripheral region NA and the wiring region 500 located between the integrated circuit IC and the multiplexer 400. Signals output by the integrated circuit IC are transmitted to the multiplexer 400 through respective signal lines in the wiring region 500. Then, under control of a signal control end of the multiplexer 400, signals are output to respective pixel units P in the display region AA. With the multiplexer 400, the number of signal lines arranged in the wiring region may be reduced, thereby reducing wiring pressure in the wiring region.

The scanning driving circuit 300 may be located in the peripheral region NA on a side of the peripheral region NA close to the third boundary AA3 and on a side of the peripheral region NA close to fourth boundary AA4. It should be noted that, although the driving circuit shown in FIG. 1 is located on left and right sides of the display region AA, the embodiment of the present disclosure is not limited to this, and the driving circuit may be located at any suitable position in the peripheral region NA.

For example, the scanning driving circuit 300 may include at least one of a first scanning driving circuit (e.g. a light-emitting control scanning driving circuit) and a second scanning driving circuit (a gate scanning driving circuit). For example, the gate scanning driving circuit and the light-emitting control scanning driving circuit may be based on GOA technology, that is, the scanning driving circuit 300 may include at least one of Gate GOA and EM GOA. In GOA technology, the gate driving circuit and the light-emitting control scanning driving circuit are directly disposed on an array substrate to replace an external driving chip. Each GOA unit is taken as a stage of shift register. Each stage of shift register is electrically connected to a gate line or a light-emitting control line. Through outputting a switching voltage by the shift registers sequentially, a scanning of pixels row by row may be realized. In some embodiments, each shift register may be connected to a plurality of gate lines or a plurality of light-emitting control lines. In this way, it may adapt to a development trend of high resolution and narrow border of the display panel.

In the embodiment of the present disclosure, the scanning driving circuit 300 may include a plurality of thin film transistors and at least one capacitor. For example, each of Gate GOA and EM GOA may include a plurality of thin film transistors and at least one capacitor. In the present disclosure, the expression "orthographic projection of the scanning driving circuit on the base substrate" may represent an orthographic projection of a region in which the scanning driving circuit is located on the base substrate. Specifically, the scanning driving circuit may include a plurality of rows of shift registers, and each shift register may include a plurality of thin film transistors and at least one capacitor. A region in which the scanning driving circuit is located may be a region defined by a boundary of a periphery of the thin film transistors or the capacitors forming the shift registers of all the rows. For example, the at least one scanning driving circuit 300 may include a first scanning driving circuit 301 and a second scanning driving circuit 302, wherein the first scanning driving circuit 301 may include an EM GOA circuit, and the second scanning driving circuit 302 may include a GATE GOA circuit. The first scanning driving circuit 301 may include a plurality of rows of shift registers forming the EM GOA, and each shift register may include a plurality of thin film transistors and at least one capacitor. A region in which the first scanning driving circuit is located may be defined by a boundary of a periphery of the thin film transistors or the capacitors forming the shift registers in all the rows of the EM GOA. Accordingly, an orthographic projection of the first scanning driving circuit on the base substrate may represent an orthographic projection of a region in which the EM GOA circuit is located on the base substrate. The second scanning driving circuit 302 may include a plurality of rows of shift registers forming the GATE GOA, and each shift register may include a plurality of thin film transistors and at least one capacitor. A region in which the second scanning driving circuit is located may be defined by a boundary of a periphery of the thin film transistors or the capacitors forming the shift registers in all the rows of the GATE GOA. Accordingly, an orthographic projection of the second scanning driving circuit on the base substrate may represent an orthographic projection of a region in which the GATE GOA circuit is located on the base substrate. "Orthographic projection of the at least one scanning driving circuit on the base substrate" represents the orthographic projection of the region in which at least one of the EM GOA circuit and the GATE GOA circuit is located on the base substrate.

The display panel may include a plurality of load compensation units 100. As shown in FIG. 1 and FIG. 2, some of the plurality of load compensation units 100 are located at a position close to the first rounded corner part 10A in the peripheral region NA, and some of the plurality of load compensation units 100 are located at a position close to the second rounded corner part 10B in the peripheral region NA. The plurality of load compensation units 100 are located between the test circuit 200 and the display region AA.

In the embodiment of the present disclosure, each sub-pixel SP1, SP2 or SP3 may include a light-emitting element and a pixel driving circuit for driving the light-emitting element. For example, the light-emitting device may include a first electrode, a second electrode and a light-emitting material layer between the first electrode and the second electrode. The pixel driving circuit may include elements such as transistors, capacitors, etc. The pixel driving circuit receives a signal of the signal line disposed on the display panel, generates a current driving the light-emitting device, and realizes a purpose of driving the light-emitting device to emit light through a connection to one of the first electrode or the second electrode. For example, the pixel driving circuit is disposed on the base substrate, and the light-emitting device is located on a side of the pixel driving circuit away from the base substrate. For example, the pixel driving circuit may have a circuit structure such as 7T1C, 7T2C, 8T2C or 4T1C, which is common in the art. For example, the light-emitting element may be an organic light-emitting diode (OLED) or a quantum dot light-emitting diode (QLED).

With continued reference to FIG. 1, the display panel may also include at least one dam 30 arranged on the base substrate 10. The dam(s) 30 may be disposed in the peripheral region NA. For example, each dam 30 may be disposed along a circumference of the peripheral region NA, that is, disposed as a circle to surround the display region AA. As shown in FIG. 1, at least one dam 30 is disposed on a side of the scanning driving circuit 300 away from a center AA0 of the display region AA. With the at least one dam 30, the display panel may be prevented from being invaded by the water vapor and oxygen from the outside, so as to avoid poor display.

In the embodiment of the present disclosure, the display region AA has a center AA0 and two symmetry axes AX1 and AX2. In some examples, a first symmetry axis AX1 is a straight line extending through the center AA0 in the second direction Y, and a second symmetry axis AX2 is a straight line extending through the center AA0 in the first direction X. The embodiments of the present disclosure are not limited to the above examples. For example, at least one of the first symmetry axis AX1 and the second symmetry axis AX2 may not pass through the center AA0. It should be noted that the center AA0 and the two symmetry axes AX1 and AX2 are imaginary for the convenience of description, which does not mean that there are solid center and axes in the display panel.

In the following, embodiments of the present disclosure are described in further detail by taking a display panel with thin film transistors being top gate type TFT as an example.

With reference to FIG. 2 and FIG. 3A, the display panel includes: a base substrate 10, a barrier layer or a buffer layer BL disposed on the base substrate 10, a semiconductor layer ACT disposed on a side of the barrier layer or the buffer layer BL away from the base substrate 10, a first insulating layer 111 disposed on a side of the semiconductor layer ACT away from the base substrate 10, and a first conductive layer 121 disposed on a side of the first insulating layer 111 away from the base substrate 10, a second insulating layer 112 disposed on a side of the first insulating layer 121 away from the base substrate 10, a second conductive layer 122 on a side of the second insulating layer 112 away from the base substrate 10, a third insulating layer 113 on a side of the second conductive layer 122 away from the base substrate 10, a first planarization layer PLN1 on a side of the third insulating layer 113 away from the base substrate 10, a third conductive layer 123 on a side of the first planarization layer PLN1 away from the base substrate 10, a second planarization layer PLN2 on a side of the third conductive layer 123 away from the base substrate 10, a first electrode layer 124 on a side of the second planarization layer PLN2 away from the base substrate 10, and a pixel defining layer PDL on a side of the first electrode layer 124 away from the base substrate 10.

The pixel defining layer PLD defines a plurality of openings PLDO, and a light-emitting element 52 may be located in the opening PLDO. The light-emitting element 52 may include an anode 521, a light-emitting layer 522 and a cathode 523, and the light emitting layer 522 is sandwiched between the anode 521 and the cathode 523. It should be noted that the "light-emitting layer" herein is referred as various functional layers of OLED light-emitting elements collectively. For example, it may include various functional layers such as an electron injection layer, an electron transport layer, a hole injection layer, a hole transport layer and an organic light-emitting layer.

In the embodiment of the present disclosure, the pixel driving circuit for driving each sub-pixel may include a plurality of thin film transistors 51. The thin film transistor 51 may include an active layer 511, a gate 513, a source 515 and a drain 516. The active layer 511 may be located in the semiconductor layer ACT, the gate 513 may be located in the first conductive layer 121, and the source 515 and the drain 516 may be located in the second conductive layer 122. Each of the source 515 and the drain 516 of the thin film transistor is electrically connected to the active layer 511 through a respective via hole, groove or conductive plug 517.

For example, the third conductive layer 123 may be made of the same conductive material as the second conductive layer 122. The third conductive layer 123 may be electrically connected to the source or the drain of the thin film transistor through a conductive plug formed in a via hole of the first planarization layer PLN1. The anode 521 or the cathode 523 may be electrically connected to the third conductive layer 123 through a conductive plug formed in a via hole of the second planarization layer PLN2. For example, in the illustrated embodiment, the second conductive layer 122 is electrically connected to the drain 516, and the anode 521 is electrically connected to the third conductive layer 123. In this way, the anode 521 is electrically connected to the drain 516.

With reference to FIG. 2 and FIG. 3A, the display panel may also include a spacer layer PSL arranged on a side of the pixel defining layer PDL away from the base substrate 10. The display panel includes a plurality of spacers PS located in the spacer layer PSL.

The display panel may also include an encapsulation structure 53 disposed on a side of the spacer layer PSL away from the base substrate 10. The encapsulation structure 53 includes: a first encapsulation layer 531 disposed on a side of the spacer layer away from the base substrate 10; a second encapsulation layer 532 disposed on a side of the first encapsulation layer away from the base substrate; and a third encapsulation layer 533 disposed on a side of the second encapsulation layer away from the base substrate, wherein the first encapsulation layer 531 is an inorganic material encapsulation layer, the third encapsulation layer 533 is an inorganic material encapsulation layer, and the second encapsulation layer 532 is an organic material encapsulation layer. For example, the first encapsulation layer 531 and the third encapsulation layer 533 may be formed by a deposition process such as a chemical evaporation deposition process, and the second encapsulation layer 532 may be formed by an inkjet printing process.

Figure 4:
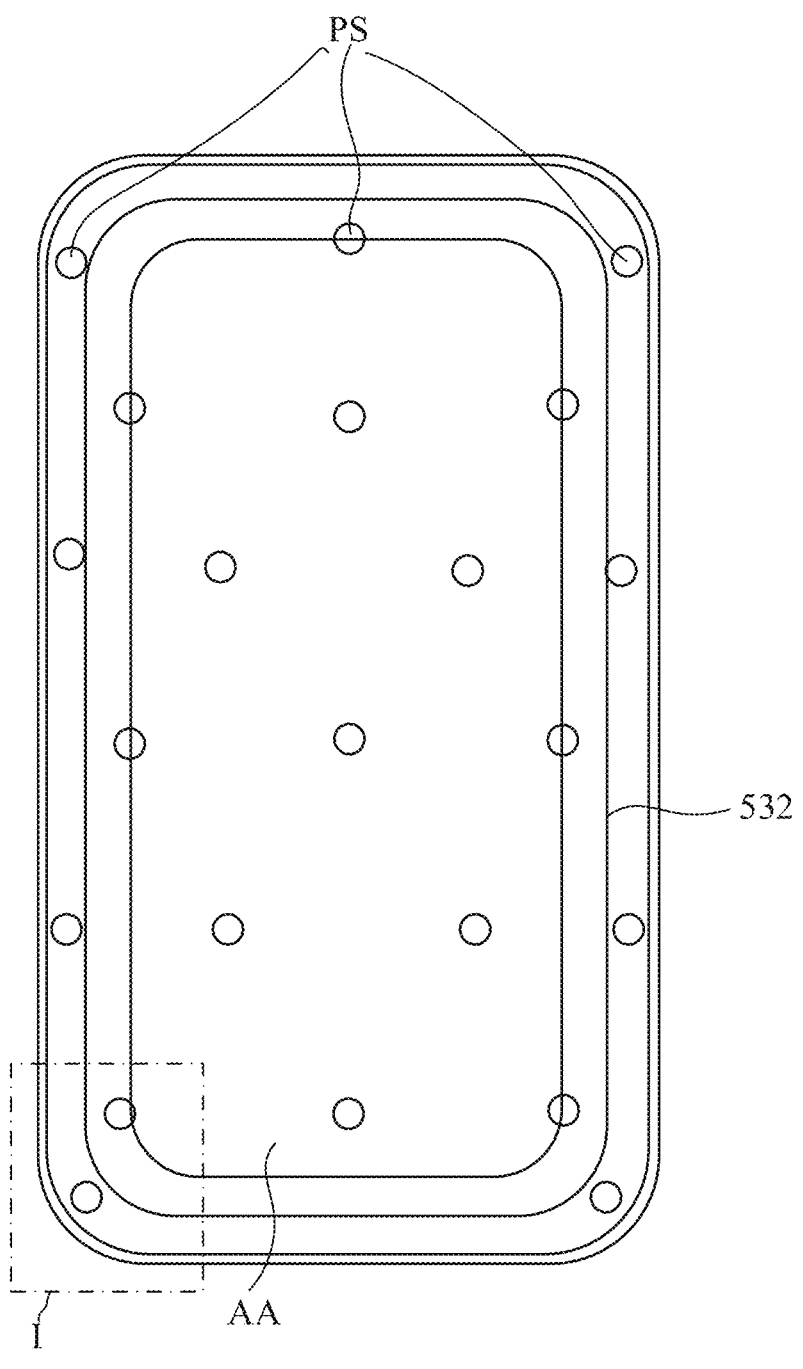
FIG. 4 is a schematic plan view of a display panel in the related technologies, in which a distribution of spacers in the display panel in the related technologies is schematically shown.
Figure 5:
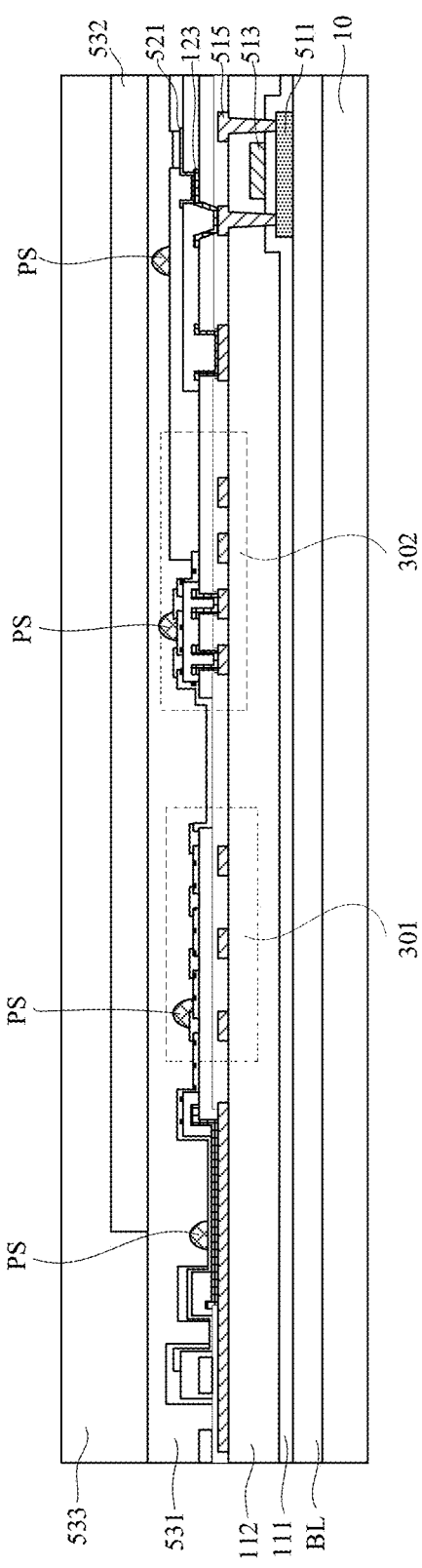
FIG. 5 is a cross-sectional view of the display panel in the related technologies in FIG. 4 along line BB'.
Figure 6:
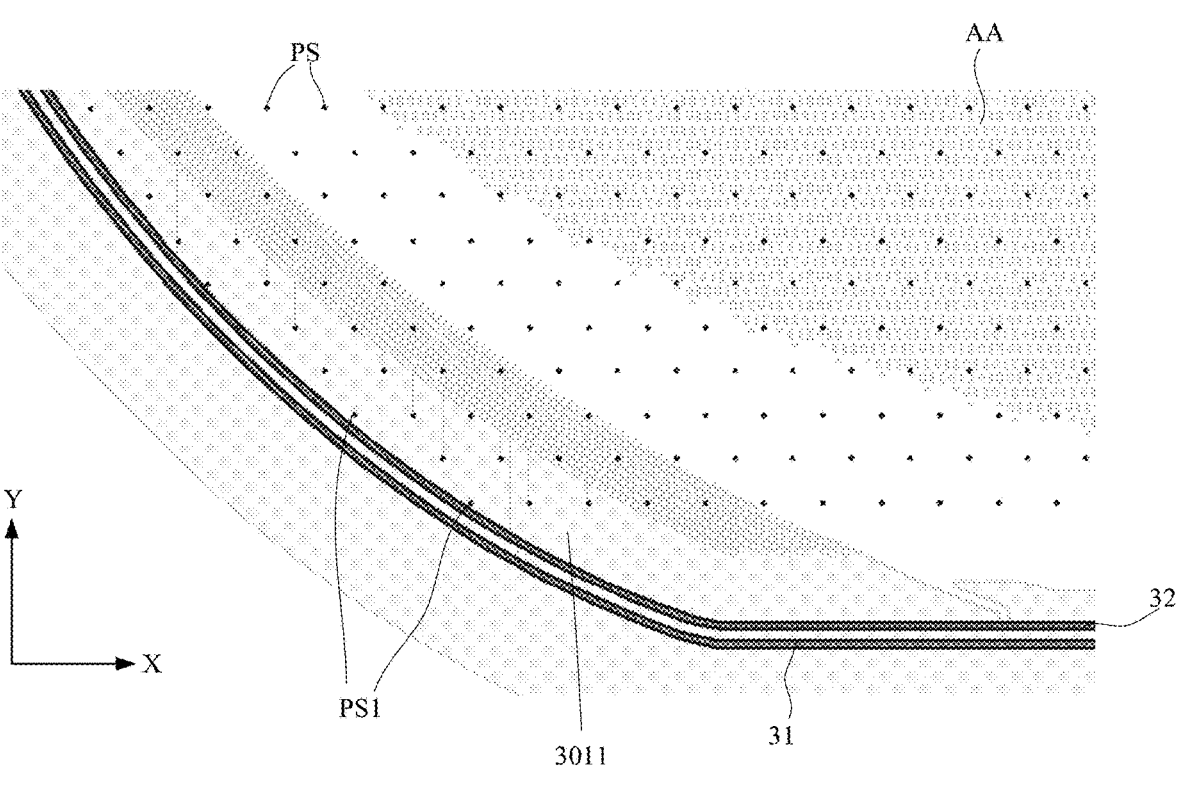
FIG. 6 is a partial enlarged view of part I in FIG. 4.

FIG. 4 is a schematic plan view of a display panel in the related technologies, in which a distribution of spacers in the display panel in the related technologies are schematically shown. FIG. 5 is a cross-sectional view of the display panel in the related technologies in FIG. 4 along line BB'. FIG. 6 is a partial enlarged view of part I in FIG. 4.

In a process of manufacturing OLED display panel, it is desired to evaporate a light-emitting material at each opening of the pixel defining layer PDL. Specifically, evaporation is performed by using a mask such as fine metal mask (FMM), so as to to form the light-emitting layer. In the evaporation process, the mask and the backplane may be separated by the above described plurality of spacers PS formed on the backplane to avoid large area contact between the backplane and the mask, thus facilitating the evaporation of the light-emitting material at each opening. When the spacer PS is in contact with the mask, an equipment alignment will cause a scratch between the mask and the spacer PS, so as to generate a PS foreign matter. In a process of forming the encapsulation structure, due to existence of PS foreign matter, it is difficult to form the first encapsulation layer 531 as a complete film. Specifically, with reference to FIGS. 4 to 6, a spacer PS is formed at the boundary of the second encapsulation layer 532 away from the center of the display region, that is, an orthogonal projection of the spacer PS on the base substrate 10 is at least partially located at an outside of the boundary of the second encapsulation layer 532. Thus, in the process of forming the encapsulation structure, it fails to ensure a thickness of the first encapsulation layer 531 in the region in which the boundary of the second encapsulation layer 532 is located due to influence of shadows, thereby causing an insufficient thickness of the first encapsulation layer 531 at this place. Besides, the inorganic material itself is relatively brittle, and the size of the orthogonal projection of the spacer PS on the base substrate 10 is small, that is, the spacer PS has a sharp cylindrical shape. In this way, the first encapsulation layer 531 suffers from being punctured by the spacer PS. That is to say, the first encapsulation layer 531 may be cracked at a position where the foreign matter is accumulated or at a position where the boundary of the second encapsulation layer 532 is located, as shown in FIG. 5. The subsequent encapsulation process may only encapsulate the surface and is unable to improve the morphology of the crack. In a reliability test or when being used in an environment of high temperature and humidity, water vapor and oxygen may easily enter the display panel through the crack of the first encapsulation layer, thereby causing a failure of the device and forming defects.

Figure 7:
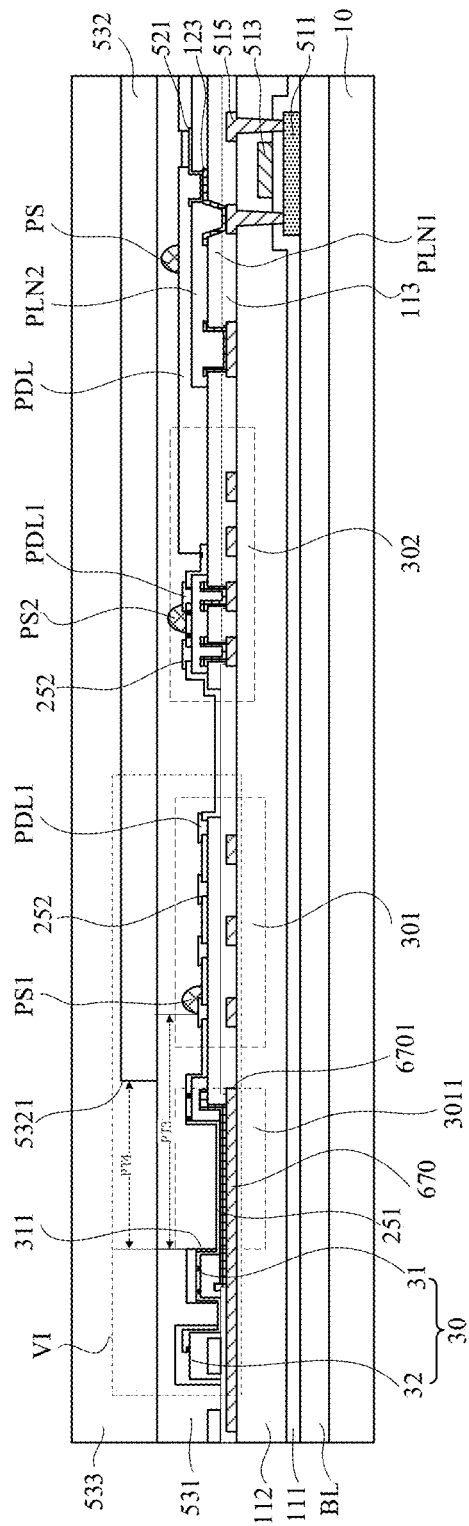
FIG. 7 is a cross-sectional view of the display panel according to some exemplary embodiments of the present disclosure in FIG. 2 along line CC'.
Figures 8, 9:
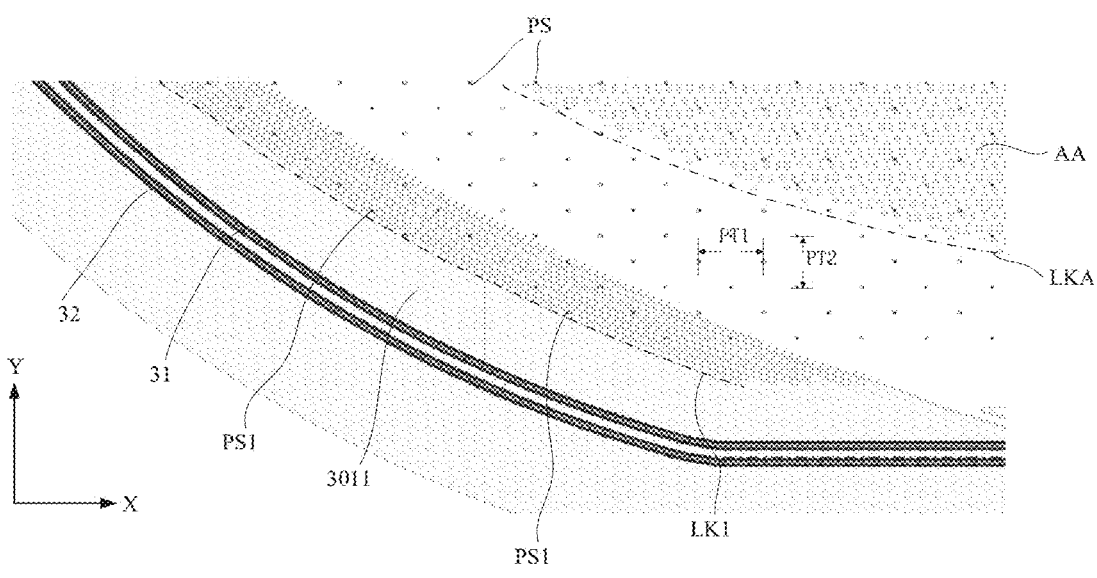
FIGS. 8 to 11 are partial enlarged views of parts II, III, IV and V in FIG. 2 respectively, in which a distribution of spacers in each corner region of a display panel according to some exemplary embodiments of the present disclosure is schematically shown.
Figure 10:
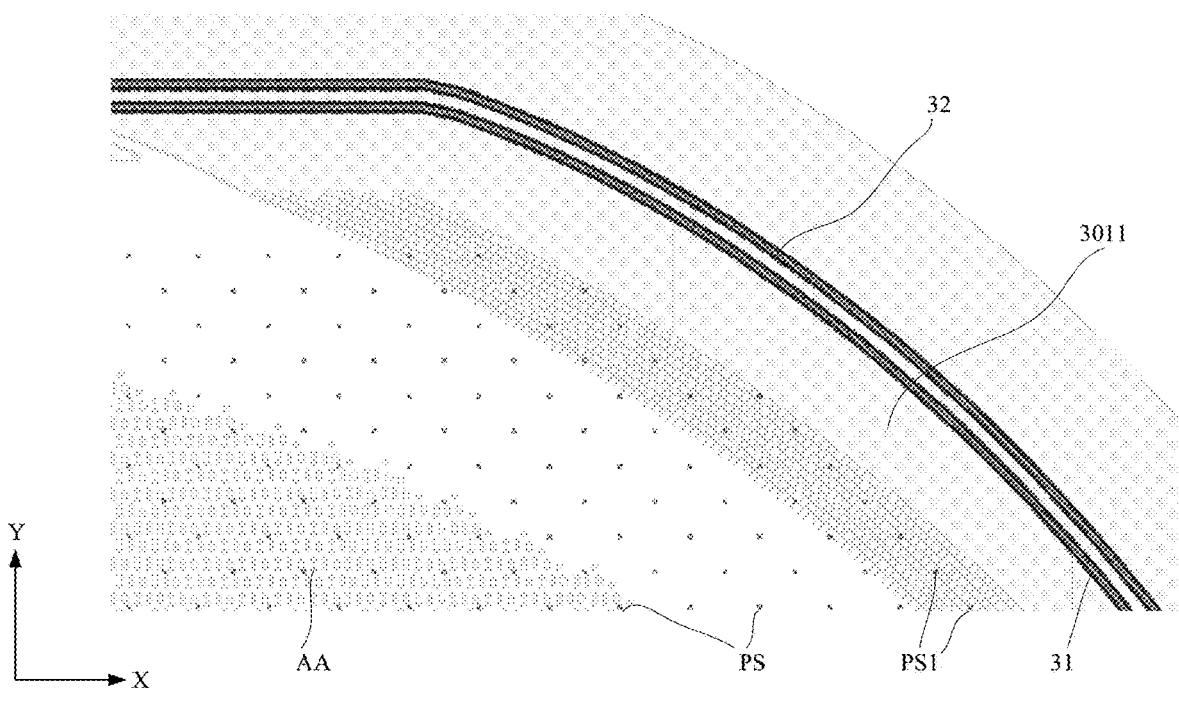
Figure 11:
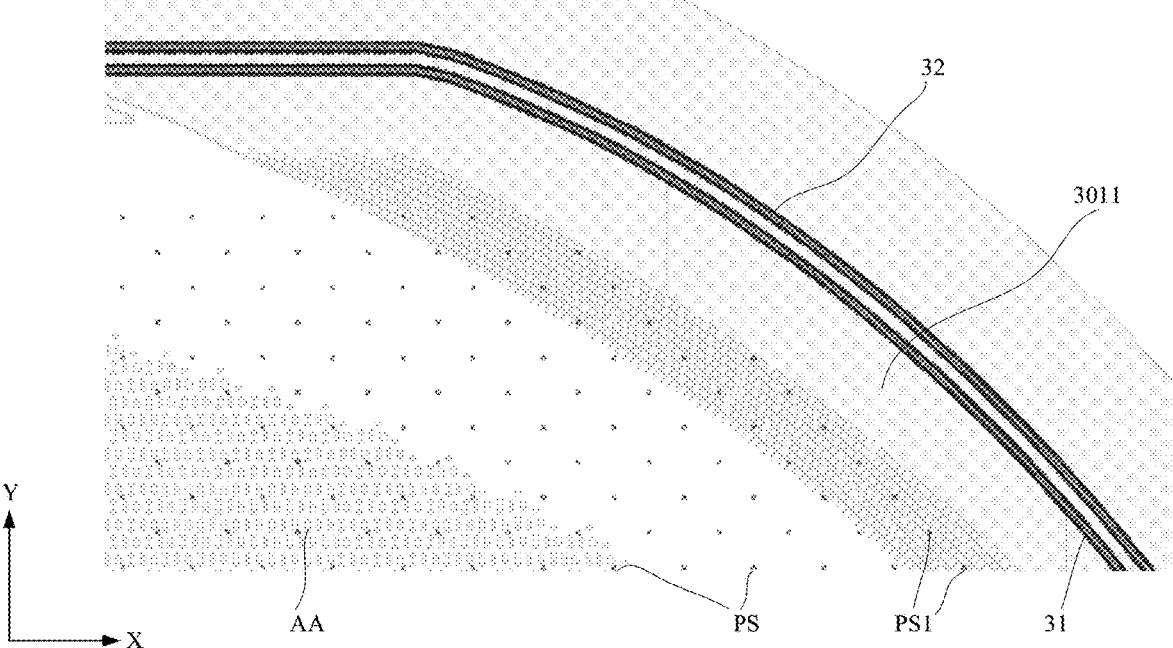
Figure 12:
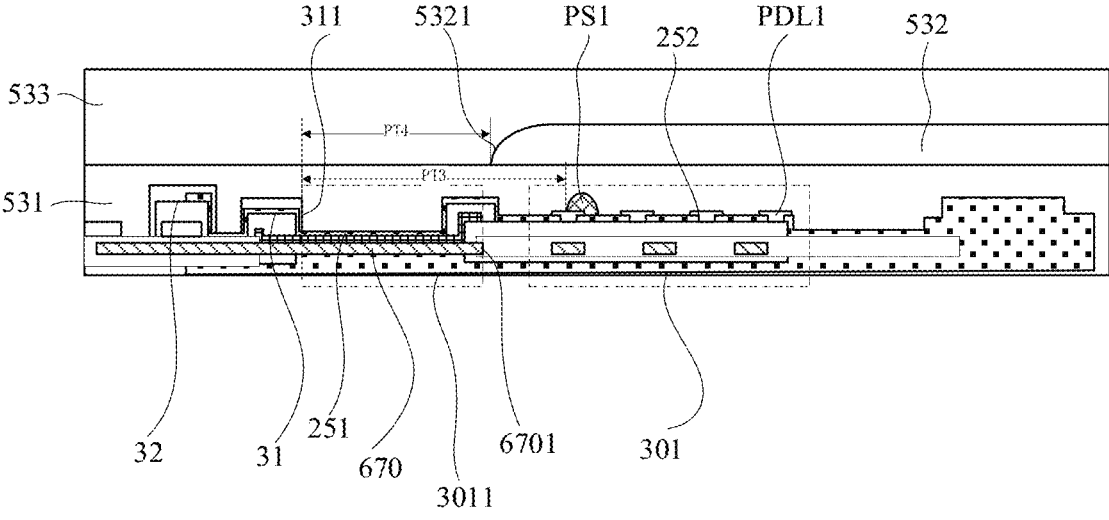
FIG. 12 is a partial enlarged view of part VI in FIG. 7.

FIG. 7 is a cross-sectional view of the display panel according to some exemplary embodiments of the present disclosure in FIG. 2 along line CC'. FIGS. 8 to 11 are partial enlarged views of parts II, III, IV and V respectively in FIG. 2 respectively, in which a distribution of spacers in each corner region of a display panel according to some exemplary embodiments of the present disclosure is schematically shown. FIG. 12 is a partial enlarged view of part VI in FIG. 7.

With reference to FIG. 2, FIG. 3A, FIG. 7 to FIG. 12, the display panel includes a plurality of spacers PS located in the spacer layer. The plurality of spacers includes first spacer(s) PS1 located in the peripheral region. Among the plurality of spacers, the first spacer(s) PS1 is/are located at a position farthest away from a center AA0 of the display region.

For example, a plurality of first spacers PS1 are arranged along a first contour line LK1 and spaced from each other. The first contour line LK1 is a contour line surrounding the display region AA and being substantially conformal as an outer contour line LKA of the display region AA, and the first contour line LK1 is spaced from the outer contour line LKA of the display region.

The plurality of spacers PS are arrayed in an array in a first direction X and a second direction Y, starting from the first spacers PS1 at periphery towards the center AA0 of the display region. That is, the first spacers PS1 include the first spacers at periphery.

For example, the plurality of spacers PS are arranged at a first interval PT1 in the first direction X and at a second interval PT2 in the second direction Y. A ratio of the first interval PT1 to the second interval PT2 is in a range of 0.8 to 1.2, including two endpoint values of 0.8 and 1.2. For example, at least one of the first interval PT1 and the second interval PT2 is in a range of 150 μm to 300 μm.

In the embodiment of the present disclosure, for the first spacer PS1, a distance between the first spacer PS1 and a spacer PS adjacent to the first spacer in the first direction X is substantially equal to the first interval PT1. For the first spacer PS1, a distance between the first spacer PS1 and a spacer PS adjacent to the first spacer in the second direction Y is substantially equal to the second interval PT2.

In the embodiment of the present disclosure, the peripheral region NA includes a first side region NA1, a second side region NA2, a third side region NA3, a fourth side region NA4 and a plurality of corner regions NA5, NA6, NA7 and NA8. For example, the first side region NA1 and the second side region NA2 are located respectively on opposite sides of the display region AA along the first direction X. The third side region NA3 and the fourth side region NA4 are located respectively on opposite sides of the display region AA along the second direction Y. Each of the plurality of corner regions NA5, NA6, NA7 and NA8 is located between respective adjacent two of the first side region, the third side region, the second side region and the fourth side region. In the embodiments shown in FIG. 1 and FIG. 2, the first side region NA1 corresponds to the third boundary AA3 of the display region AA, the second side region NA2 corresponds to the fourth boundary AA4 of the display region AA, the third side region NA3 corresponds to the first boundary AA1 of the display region AA, and the fourth side region NA4 corresponds to the second boundary AA2 of the display region AA. The plurality of corner regions NA5, NA6, NA7 and NA8 respectively correspond to the third rounded corner part 10C, the first rounded corner part 10A, the second rounded corner part 10B and the fourth rounded corner part 10D.

In the embodiment of the present disclosure, for adjacent two corner regions in the first direction X, a distribution of the spacers in one of the two corner regions is symmetrical to a distribution of the spacers in the other of the two corner regions with respect to a first symmetry axis AX1. For example, a distribution of the spacers in the corner region NA5 is symmetrical to a distribution of the spacers in the corner region NA8 with respect to the first symmetry axis AX1. A distribution of the spacers in the corner region NA6 is symmetrical to a distribution of the spacers in the corner region NA7 with respect to the first symmetry axis AX1.

For adjacent two corner regions in the second direction Y, a distribution of the spacers in one of the two corner regions is symmetrical to a distribution of the spacers in the other of the two corner regions with respect to the second symmetry axis AX2. For example, a distribution of the spacers in the corner region NA5 is symmetrical to a distribution of the spacers in the corner region NA6 with respect to the second symmetry axis AX2. A distribution of the spacers in the corner region NA7 is symmetrical to a distribution of the spacers in the corner region NA8 with respect to the second symmetry axis AX2.

In the embodiment of the present disclosure, the second encapsulation layer 532 includes a boundary 5321 located on a side of the second encapsulation layer away from the display region AA. An orthographic projection of the boundary 5321 of the second encapsulation layer on the base substrate 10 is located on a side of an orthographic projection of the at least one dam on the base substrate 10 close to the display region, and an orthographic projection of the first spacer PS1 on the base substrate 10 located on a side of the orthographic projection of the boundary 5321 of the second encapsulation layer on the base substrate 10 close to the display region. In the embodiment of the present disclosure, the first spacers at periphery are located at an inner side of the boundary of the second encapsulation layer. In this way, the second encapsulation layer is disposed at each position at which the spacer is located. The second encapsulation layer here may act as a buffer to prevent the first encapsulation layer from being punctured by the spacer. Therefore, with such arrangement, a risk of a crack of the first encapsulation layer may be effectively eliminated, thereby improving the yield of the display panel.

With reference to FIG. 2, FIG. 3A, FIG. 7 to FIG. 12, some of the plurality of first spacers PS1 are located in the at least one of the first side region NA1 and the second side region NA2 in the peripheral region, and have an orthographic projection on the base substrate that falls within the orthographic projection of the at least one scanning driving circuit 300 on the base substrate 10.

In the embodiment of the present disclosure, a part of the at least one scanning driving circuit 300 is also located in at least one of the corner regions NA5, NA6, NA7 and NA8, and some of the plurality of first spacers PS1 are located in the at least one of the corner regions NA5, NA6, NA7 and NA8, and have an orthographic projection on the base substrate 10 that falls within the orthographic projection of the at least one scanning driving circuit 300 on the base substrate 10. For example, in some exemplary embodiments, a part of the at least one scanning driving circuit 300 is also located in four corner regions NA5, NA6, NA7 and NA8 respectively. Some of the plurality of first spacers PS1 are located in the four corner regions NA5, NA6, NA7 and NA8, and have an orthographic projection on the base substrate that respectively falls within the orthographic projection of the at least one scanning driving circuit 300 on the base substrate 10.

For example, the at least one scanning driving circuit 300 may include a first scanning driving circuit 301 and a second scanning driving circuit 302. The first scanning driving circuit 301 is configured to provide a light-emitting control signal to the pixel driving circuit of at least one of the plurality of sub-pixels, that is, the first scanning driving circuit 301 may include an EM GOA circuit. The second scanning driving circuit 302 is configured to provide a gate scanning signal to the pixel driving circuit of at least one of the plurality of sub-pixels, that is, the second scanning driving circuit 302 may include a GATE GOA circuit. An orthographic projection of the first scanning driving circuit 301 on the base substrate 10 is located on a side of an orthographic projection of the second scanning driving circuit 302 on the base substrate 10 away from the display region, that is, the first scanning driving circuit 301 is located at the outer side.

In the embodiment of the present disclosure, an orthographic projection of some of the first spacers PS1 on the base substrate 10 falls within the orthographic projection of the first scanning driving circuit 301 on the base substrate 10. That is to say, in the display panel, an orthographic projection of some of the first spacers PS1 at periphery on the base substrate 10 falls within an orthographic projection of the EM GOA circuit on the base substrate 10. In the embodiment of the present disclosure, all spacers are disposed in the display region and a region in which the scanning driving circuit is located. With this arrangement, a potential risk of generating a crack in the first encapsulation layer may be effectively eliminated, thereby improving the yield of the display panel.

In the embodiment of the present disclosure, an orthographic projection of a part of the boundary 5321 of the second encapsulation layer on the base substrate 10 falls within the orthographic projection of the at least one scanning driving circuit 300 on the base substrate 10. For example, the orthographic projection of a part of the boundary 5321 of the second encapsulation layer on the base substrate 10 falls within the orthographic projection of the first scanning driving circuit 301 on the base substrate 10. That is to say, the orthographic projection of the boundary 5321 of the second encapsulation layer on the base substrate 10 is a closed contour line. In the first side region NA1, the second side region NA2, and at least one of the corner regions NA5, NA6, NA7 and NA8, the orthographic projection of a part of the closed contour line on the base substrate 10 falls within the orthographic projection of the first scanning driving circuit 301 on the base substrate 10. Compared with the boundary of the second encapsulation layer in the related technologies, a shrink design of the second encapsulation layer is employed in the embodiment of the present disclosure. With this arrangement, a potential risk of generating a crack in the first encapsulation layer may be effectively eliminated, thereby improving the yield of the display panel.

With reference to FIG. 7, the display panel also includes a first voltage lead 670 for transmitting a first voltage. The orthographic projection of the at least one dam 30 on the base substrate 10 at least partially overlaps with an orthographic projection of the first voltage lead 670 on the base substrate 10. In some examples, the orthographic projection of the at least one dam 30 on the base substrate 10 falls within the orthographic projection of the first voltage lead 670 on the base substrate 10.

For example, the first voltage may be VSS voltage, which may be about-5V.

An orthographic projection of some of the first spacers PS1 on the base substrate and the orthographic projection of the first voltage lead 670 on the base substrate are spaced from each other, and the orthographic projection of some the first spacers PS1 on the base substrate is located on a side of the orthographic projection of the first voltage lead 670 on the base substrate close to the display region. That is, the orthographic projection of some of the first spacers PS1 on the base substrate does not overlap with the orthographic projection of the first voltage lead 670 on the base substrate, and the orthographic projection of some of the first spacers PS1 on the base substrate is located on an inner side of the orthographic projection of the first voltage lead 670 on the base substrate.

The orthographic projection of at least a part of the boundary 5321 of the second encapsulation layer on the base substrate and the orthographic projection of the first voltage lead 670 on the base substrate are spaced from each other, and the orthographic projection of at least a part of the boundary 5321 of the second encapsulation layer on the base substrate is located on the side of the orthographic projection of the first voltage lead 670 on the base substrate close to the display region.

For example, in the embodiment of the present disclosure, the at least one dam 30 includes a first dam 31. Among the at least one dam, the first dam 31 is located at a position closest to the center AA0 of the display region, that is, the first dam 31 is a dam located at an innermost side.

For example, the at least one dam 30 also includes a second dam 32, which is located on a side of the first dam 31 away from the display region. By providing a plurality of dams, the dam's ability of preventing water and oxygen invasion may be improved. It should be noted that the embodiments of the present disclosure are not limited to this, and fewer (for example, one) or more dams may be disposed as desired in practice.

In the embodiment of the present disclosure, there is a transition region 3011 between the first scanning driving circuit 301 and the first dam 31. Specifically, the first voltage lead 670 includes a first lead boundary 6701 close to the display region. The first lead boundary 6701 is a boundary of the display region closest to the orthographic projection of the first voltage lead 670 on the base substrate. The first dam 31 includes a first dam boundary 311 close to the display region. The first dam boundary 311 is a boundary of the display region closest to the orthographic projection of the first dam 31 on the base substrate. The first lead boundary 6701 is closer to the display region than the first dam boundary 311. In the transition region 3011, the encapsulation structure 53 includes only the first encapsulation layer 531 and the third encapsulation layer 533, and the transition region 3011 is not provided with the plurality of spacers PS. In other words, neither the second encapsulation layer 532 nor the spacer PS is disposed in the transition region 3011.

In the embodiment of the present disclosure, the first spacer PS1 and the boundary 5321 of the second encapsulation layer are both spaced from the first dam 31. Specifically, the orthographic projection of the first spacer PS1 on the base substrate and the orthographic projection of the first dam 31 on the base substrate are separated by a first distance PT3, and the first distance PT3 is no less than 100 μm. The orthographic projection of the boundary 5321 of the second encapsulation layer on the base substrate and the orthographic projection of the first dam 31 on the base substrate are separated by a second distance PT4. The second distance PT4 is less than the first distance PT3, and the second distance PT4 is no less than 100 μm.

For example, at least one of the first distance PT3 and the second distance PT4 is in a range of 100 μm to 300 μm.

With reference to FIG. 7, the display panel also includes an auxiliary conductive part 251 located in the peripheral region NA, wherein the auxiliary conductive part 251 is located in the first electrode layer 124, and the auxiliary conductive part 251 is electrically connected to a first voltage lead 670. In the embodiment of the present disclosure, the first voltage lead 670 in the second conductive layer 122 and the auxiliary conductive part 251 in the first electrode layer 124 are connected in parallel for transmitting the first voltage (e.g. VSS). In this way, a resistance of the signal line for transmitting the first voltage VSS may be reduced.

With continued reference to FIG. 7, an orthographic projection of the auxiliary conductive part 251 on the base substrate 10 at least partially overlaps with the orthographic projection of at least one scanning driving circuit 300 on the base substrate 10. For example, the orthographic projection of the auxiliary conductive part 251 on the base substrate 10 may substantially cover the entire orthographic projection of the first scanning driving circuit 301 on the base substrate 10. The orthographic projection of the auxiliary conductive part 251 on the base substrate 10 may partially overlap with the orthographic projection of the second scanning driving circuit 302 on the base substrate 10. That is, the width of the auxiliary conductive part 251 is lager, which is conducive to further reducing the resistance of the signal line for transmitting the first voltage VSS.

For example, the display panel also includes a plurality of openings 252 provided in the auxiliary conductive part 251, wherein each of the plurality of openings 252 exposes a part of the planarization layer PLN2. The planarization layer PLN2 is generally made of an organic resin material. There are some volatile organic substances such as organic solvents or small molecular materials in the planarization layer PLN2. These organic substances are easy to volatilize in the subsequent manufacturing process of the display panel, causing a deflation of the planarization layer. By disposing the plurality of openings 252 in the auxiliary conductive part 251, it is beneficial for the organic substances in the planarization layer PLN2 to volatilize in the subsequent manufacturing process of the display panel, so as to avoid an accumulation of bubbles on the surface of the auxiliary conductive part 251 facing the planarization layer PLN2. In this way, it is beneficial to ensure the yield of the display panel, so as to ensure a good display effect of the display panel.

The display panel also includes a plurality of first covering parts PDL1, which are located in the pixel defining layer PDL. The plurality of first covering parts PDL1 respectively cover the plurality of openings 252.

In the embodiment of the present disclosure, the orthographic projection of at least some of the first spacers PS1 on the base substrate at least partially overlaps with an orthographic projection of at least some of the first covering parts PDL1 on the base substrate. The orthographic projection of at least some of the first spacers PS1 on the base substrate at least partially overlaps with an orthographic projection of the auxiliary conductive part 251 on the base substrate. For example, the orthographic projection of a first spacer PS1 on the base substrate partially overlaps with the orthographic projection of the first covering part PDL1 on the base substrate, and the orthographic projection of the same first spacer PS1 on the base substrate partially overlaps with the orthographic projection of the auxiliary conductive part 251 on the base substrate.

For example, the plurality of spacers PS includes second spacers PS2 located in the peripheral region. An orthographic projection of the second spacers PS2 on the base substrate is located on a side of the orthographic projection of the first spacers PS1 on the base substrate close to the display region. An orthographic projection of some of the second spacers PS2 on the base substrate falls within an orthographic projection of the second scanning driving circuit 302 on the base substrate.

In the embodiment of the present disclosure, the orthographic projection of at least some of the second spacers PS2 on the base substrate at least partially overlaps with the orthographic projection of at least some of the first covering parts PDL1 on the base substrate. The orthographic projection of at least some of the second spacers PS2 on the base substrate at least partially overlaps with the orthographic projection of the auxiliary conductive part 251 on the base substrate. For example, the orthographic projection of a second spacer PS2 on the base substrate partially overlaps with the orthographic projection of the first covering part PDL1 on the base substrate, and the orthographic projection of the same second spacer PS2 on the base substrate partially overlaps with the orthographic projection of the auxiliary conductive part 251 on the base substrate.

In other embodiments of the present disclosure, there is further provided a display device. The display device may include the display panel described above. For example, the display device may be a smart phone, mobile phone, video phone, e-book reader, desktop computer (PC), laptop PC, netbook PC, personal digital assistant (PDA), portable multimedia player (PMP), digital audio player, mobile medical device, camera, wearable device (e.g., headworn device, electronic clothing, electronic bracelet or smart watch), etc.

Although some embodiments of the general inventive concept according to the present disclosure have been illustrated and explained, those skilled in the art will understand that these embodiments may be changed without departing from the principles and spirit of the general inventive concept of the present disclosure. The scope of the present disclosure is limited by the claims and their equivalents.

What is claimed is:

1. A display panel, comprising:
   a base substrate, the base substrate comprising a display region and a peripheral region;
   a plurality of sub-pixels disposed in the display region, wherein the sub-pixel comprises a first electrode, a second electrode and a functional layer between the first electrode and the second electrode;
   at least one dam disposed in the peripheral region;
   a first electrode layer disposed on the base substrate, wherein the first electrodes of the plurality of sub-pixels are located in the first electrode layer;
   a pixel defining layer disposed on a side of the first electrode layer away from the base substrate;
   a spacer layer disposed on a side of the pixel defining layer away from the base substrate; and
   an encapsulation structure disposed on a side of the spacer layer away from the base substrate, the encapsulation structure comprising: a first encapsulation layer disposed on the side of the spacer layer away from the base substrate, a second encapsulation layer disposed on a side of the first encapsulation layer away from the base substrate, and a third encapsulation layer disposed on a side of the second encapsulation layer away from the base substrate, wherein the first encapsulation layer is an inorganic material encapsulation layer, the third encapsulation layer is an inorganic material encapsulation layer, and the second encapsulation layer is an organic material encapsulation layer,
   wherein the display panel comprises a plurality of spacers located in the spacer layer, the plurality of spacers comprise a first spacer located in the peripheral region, and the first spacer is located at a position farthest away from a center of the display region among the plurality of spacers;
   wherein the second encapsulation layer comprises a boundary located on a side of the second encapsulation layer away from the display region, and the boundary is a boundary of a part, that protrudes from the display region, of the second encapsulation layer;
   wherein an orthographic projection of the boundary of the second encapsulation layer on the base substrate is located on a side of an orthographic projection of the at least one dam on the base substrate close to the display region, and an orthographic projection of the first spacer on the base substrate is located on a side of the orthographic projection of the boundary of the second encapsulation layer on the base substrate close to the display region; and
   wherein the display panel further comprises:
      a planarization layer located on a side of the first electrode layer close to the base substrate;
      an auxiliary conductive part located in the peripheral region, wherein the auxiliary conductive part is located in the first electrode layer, and the auxiliary conductive part is electrically connected to a first voltage lead;
      a plurality of openings provided in the auxiliary conductive part, wherein each of the plurality of openings exposes a part of the planarization layer; and
      a plurality of first covering parts located in the pixel defining layer, wherein the plurality of first covering parts respectively cover the plurality of openings.

2. The display panel of claim 1, wherein the peripheral region comprises a first side region and a second side region that are respectively located on opposite sides of the display region along the first direction;
   the display panel further comprises at least one scanning driving circuit disposed in at least one of the first side region and the second side region of the peripheral region, and the scanning driving circuit is configured to provide a scanning driving signal to a pixel driving circuit of at least one of the plurality of sub-pixels; and
   the display panel comprises a plurality of first spacers, and some of the plurality of first spacers are located in at least one of the first side region and the second side region of the peripheral region, and have an orthographic projection on the base substrate that falls within an orthographic projection of the at least one scanning driving circuit on the base substrate.

3. The display panel of claim 2, wherein the peripheral region further comprises a third side region, a fourth side region and a plurality of corner regions, the third side region and the fourth side region are respectively located on opposite sides of the display region along the second direction, and each of the plurality of corner regions is located between respective adjacent two of the first side region, the third side region, the second side region and the fourth side region;
   a part of the at least one scanning driving circuit is further located in at least one corner region; and
   some of the plurality of first spacers are located in the at least one corner region, and have an orthographic projection on the base substrate that falls within the orthographic projection of the at least one scanning driving circuit on the base substrate.

4. The display panel of claim 3, wherein the at least one scanning driving circuit comprises a first scanning driving circuit and a second scanning driving circuit, the first scanning driving circuit is configured to provide a light-emitting control signal to the pixel driving circuit of at least one of the plurality of sub-pixels, the second scanning driving circuit is configured to provide a gate scanning signal to the pixel driving circuit of at least one of the plurality of sub-pixels, and an orthographic projection of the first scanning driving circuit on the base substrate is located on a side of an orthographic projection of the second scanning driving circuit on the base substrate away from the display region; and an orthographic projection of some of the first spacers on the base substrate falls within the orthographic projection of the first scanning driving circuit on the base substrate.

5. The display panel of claim 4, wherein an orthographic projection of a part of the boundary of the second encapsulation layer on the base substrate falls within the orthographic projection of the at least one scanning driving circuit on the base substrate.

6. The display panel of claim 4, wherein an orthographic projection of a part of the boundary of the second encapsulation layer on the base substrate falls within the orthographic projection of the first scanning driving circuit on the base substrate.

7. The display panel of claim 1, wherein the display panel further comprises a first voltage lead for transmitting a first voltage, and wherein:

the orthographic projection of the at least one dam on the base substrate at least partially overlaps with an orthographic projection of the first voltage lead on the base substrate; and an orthographic projection of some of the first spacers on the base substrate and the orthographic projection of the first voltage lead on the base substrate are spaced from each other, and the orthographic projection of some of the first spacers on the base substrate is located on a side of the orthographic projection of the first voltage lead on the base substrate close to the display region.

8. The display panel of claim 7, wherein an orthographic projection of at least a part of the boundary of the second encapsulation layer on the base substrate and the orthographic projection of the first voltage lead on the base substrate are spaced from each other, and the orthographic projection of at least a part of the boundary of the second encapsulation layer on the base substrate is located on the side of the orthographic projection of the first voltage lead on the base substrate close to the display region.

9. The display panel of claim 1, wherein the at least one dam comprises a first dam, and the first dam is located at a position closest to the center of the display region among the at least one dam; and the orthographic projection of the first spacer on the base substrate is spaced from an orthographic projection of the first dam on the base substrate by a first distance, and the first distance is no less than 100 μm.

10. The display panel of claim 9, wherein the orthographic projection of the boundary of the second encapsulation layer on the base substrate is spaced from the orthographic projection of the first dam on the base substrate by a second distance, the second distance is less than the first distance, and the second distance is no less than 100 μm; and wherein at least one of the first distance or the second distance is in a range of 100 μm to 300 μm.

11. The display panel of claim 7, wherein:

the first voltage lead comprises a first lead boundary close to the display region, the first lead boundary is a boundary of the orthographic projection of the first voltage lead on the base substrate closest to the display region;

the first dam comprises a first dam boundary close to the display region, and the first dam boundary is a boundary of an orthographic projection of the first dam on the base substrate closest to the display region; and the first lead boundary is closer to the display region than the first dam boundary, the encapsulation structure comprises only the first encapsulation layer and the third encapsulation layer in a transition region between the first lead boundary and the first dam boundary, and the plurality of spacers are not disposed in the transition region.

12. The display panel of claim 1, wherein a plurality of first spacers are arranged along a first contour line and spaced from each other, the first contour line is a contour line surrounding the display region and being substantially conformal as an outer contour line of the display region, and the first contour line is spaced from the outer contour line of the display region; and the plurality of spacers are arranged in an array in a first direction and a second direction, starting from the first spacers at periphery towards the center of the display region.

13. The display panel of claim 12, wherein the plurality of spacers are arranged at a first interval in the first direction and at a second interval in the second direction, and a ratio of the first interval to the second interval is in a range of 0.8 to 1.2.

14. The display panel of claim 13, wherein for the first spacer, a distance between the first spacer and a spacer adjacent to the first spacer in the first direction is substantially equal to the first interval; and/or for the first spacer, a distance between the first spacer and a spacer adjacent to the first spacer in the second direction is substantially equal to the second interval.

15. The display panel of claim 13, wherein for adjacent two corner regions in the first direction, a distribution of the spacers in one of the two corner regions is symmetrical to a distribution of the spacers in the other of the two corner regions with respect to a first symmetry axis; and/or, for adjacent two corner regions in the second direction, a distribution of the spacers in one of the two corner regions is symmetrical to a distribution of the spacers in the other of the two corner regions with respect to a second symmetry axis.

16. The display panel of claim 1, wherein an orthographic projection of at least some of the first spacers on the base substrate at least partially overlaps with an orthographic projection of at least some of the first covering parts on the base substrate; and/or, the orthographic projection of at least some of the first spacers on the base substrate at least partially overlaps with an orthographic projection of the auxiliary conductive part on the base substrate.

17. The display panel of claim 16, wherein the plurality of spacers comprise second spacers located in the peripheral region, and an orthographic projection of the second spacers on the base substrate is located on a side of the orthographic projection of the first spacers on the base substrate close to the display region; and an orthographic projection of some of the second spacers on the base substrate falls within an orthographic projection of a second scanning driving circuit on the base substrate.

18. The display panel of claim 17, wherein an orthographic projection of at least some of the second spacers on the base substrate at least partially overlaps with the orthographic projection of at least some of the first covering parts on the base substrate; and/or, the orthographic projection of at least some of the second spacers on the base substrate at least partially overlaps with the orthographic projection of the auxiliary conductive part on the base substrate.

19. A display device comprising the display panel of claim 1.

\* \* \* \* \*